(12) United States Patent
Tiemann et al.

(10) Patent No.: US 6,472,882 B1
(45) Date of Patent: Oct. 29, 2002

(54) FAIL-SAFE ELECTRONIC CIRCUIT BREAKER

(75) Inventors: Jerome Johnson Tiemann, Schenectady; Richard Dudley Baertsch, Scotia, both of NY (US)

(73) Assignee: General Electric Company, Niskayuna, NY (US)

( * ) Notice: Subject to any disclaimer, the term of this patent is extended or adjusted under 35 U.S.C. 154(b) by 10 days.

(21) Appl. No.: 09/693,171

(22) Filed: Oct. 23, 2000

(51) Int. Cl.[7] .................. G01R 31/14; G01R 31/02; H02H 3/00; H02H 5/04
(52) U.S. Cl. .................. 324/509; 324/424; 361/42; 361/104
(58) Field of Search ................ 324/424, 508, 324/509; 361/42, 104, 45, 48

(56) References Cited

U.S. PATENT DOCUMENTS 5,956,218 A  9/1999  Berthold
6,266,219 B1 * 7/2001  Macbeth et al. .............. 361/42
6,324,043 B1 * 11/2001 Turner ........................ 361/104

* cited by examiner

*Primary Examiner*—N. Le
*Assistant Examiner*—James Kerveros
(74) *Attorney, Agent, or Firm*—John F. Thompson; Donald S. Ingraham

(57) ABSTRACT

The fail-safe electronic circuit breaker includes a test circuit connected to a fault detection circuit. The test circuit selectively generates a simulated circuit fault that is supplied to the fault detection circuit. The fail-safe electronic circuit breaker also includes a trip mechanism disabler that is connected to the test circuit. The trip mechanism disabler permanently disables the fail-safe electronic circuit breaker when the fault detection circuit fails to detect the simulated circuit fault after about a predetermined amount of time.

38 Claims, 9 Drawing Sheets

FAIL-SAFE ELECTRONIC CIRCUIT BREAKER

BACKGROUND OF THE INVENTION

The present invention relates to a circuit breaker and more particularly to a fail-safe electronic circuit breaker that becomes permanently disabled if a simulated circuit fault is not detected within a predetermined amount of time.

Typically, electrical appliances receive alternating current (AC) power from a power source. The electric appliance receives current from the power source via an electrical outlet that is connected to a plurality of electrical conductors to create an electrical circuit. The plurality of electrical conductors generally includes at least a line conductor and neutral conductor.

The connection of the electrical appliance to the power source can present some problematic conditions. For example, a ground fault condition may occur in the electrical conductors and/or the electrical circuit. A ground fault condition exists when there is an imbalance between the current flowing between the line conductor and the neutral conductor. In addition, an arc fault condition may occur in the electrical conductors and/or the electrical circuit. An arc fault condition is an intermittent high impedance fault that is caused, for example, by worn insulation, loose connections and broken conductors.

These circuit faults can present problematic conditions to, for example the appliance, user, and repair personnel. Therefore, circuit breakers have been developed that use sophisticated electronic circuitry to detect the various circuit fault conditions and to interrupt current flowing through the electrical conductors when the circuit fault is detected. To improve the reliability of the circuit breaker, test circuits are provided that can be used to test the circuit breaker to determine the functionality of electronic circuitry and tripping mechanism of the circuit breaker. The test circuit simulates various fault conditions that should be detected by the circuit breaker.

The test circuit provides an important benefit to the appliance, users and repair personnel and ensures that the entire electronic circuitry of the circuit breaker is functioning properly to detect various circuit fault conditions. A circuit breaker that fails to detect a simulated circuit fault from a test circuit is also likely to fail to detect actual circuit faults that may be present in the conductors and/or the circuit comprising the appliance connected to the power source. Therefore, in the event that a circuit breaker fails to detect a simulated fault from the test circuit, the circuit breaker should be replaced or rendered non-functional. As discussed above, failure to detect any or all circuit faults presents problematic conditions for the appliance, the user and repair personnel. Therefore, it is desired that a circuit breaker be produced that is rendered non-functional if the circuit breaker fails to detect a simulated circuit fault produced by a test circuit.

BRIEF SUMMARY OF THE INVENTION

In one exemplary embodiment of the present invention, a fail-safe electronic circuit breaker is provided that has a test circuit connected to a fault detection circuit. The test circuit selectively generates a simulated circuit fault. The fail-safe electronic circuit breaker also includes a trip mechanism connected to the fault detection circuit. The trip mechanism includes a trip lever connected to the fault detection circuit for tripping the fail-safe electronic circuit breaker when the fault detection circuit detects a circuit fault. In addition, a test-error mechanism is provided and is connected to the test circuit. The test-error mechanism has at least a first position and a second position. The test-error mechanism comprises a fusible link that is connected to the test circuit. The fusible link retains a first end and a second end of the test-error mechanism in the first position. The fusible link liquefies when the fault detection circuit fails to detect the simulated circuit fault after about the predetermined amount of time. The test-error mechanism also includes a bias member that is positioned between the first end and the second end. In a representative embodiment, the bias member comprises a spring that is in a state of compression with respect to a relaxed state.

The bias member places the test-error mechanism in the second position when the fusible link is liquefied. When in the second position, the test-error mechanism contacts the trip lever and after causing the fail-safe electronic circuit breaker to trip, permanently disables the fail-safe electronic circuit breaker when the test-error mechanism is in the second position.

In another exemplary embodiment, a fail-safe electronic circuit breaker is provided that has a test circuit connected to a fault detection circuit. The test circuit selectively generates a simulated circuit fault. The fail-safe electronic circuit breaker also includes a trip mechanism connected to the fault detection circuit. The trip mechanism trips the fail-safe electronic circuit breaker when the fault detection circuit detects a circuit fault. A test-error mechanism is connected to the test circuit. The test-error mechanism has at least a first position and a second position. In addition, the test-error mechanism includes a fusible link that is connected to the test circuit. The fusible link retains a first end and a second end of the test-error mechanism in the first position. The fusible link liquefies when the fault detection circuit fails to detect the simulated fault after about the predetermined amount of time. A bias member is positioned between the first end and the second end. The bias member places the test-error mechanism in the second position when the fusible link is liquefied. In addition, a heating element is connected to a power source and emits heat when the test-error mechanism is in the second position. A bimetallic strip is positioned proximate to the heating element. The bimetallic strip has at least a first state and a second state, and the bi-metallic strip enters the second state after being heated by the heating element. When in the second state, the bi-metallic strip causes the trip mechanism to trip the fail-safe electronic circuit breaker.

DETAILED DESCRIPTION OF THE INVENTION

In one exemplary embodiment, a fail-safe electronic circuit breaker 100 is provided that includes a test circuit 130 and a trip mechanism disabler 140. The test circuit 130 selectively generates simulated circuit faults. In the event that the fail-safe electronic circuit breaker 100 fails to detect the simulated circuit fault produced by the test circuit 130, the trip mechanism disabler 140 irreversibly and/or permanently disables the fail-safe electronic circuit breaker 100. The permanent disablement of the fail-safe electronic circuit breaker 100 ensures that various circuit faults do not cause any problematic conditions during operation of a load (not shown), such as, for example, an appliance.

Figure 1:
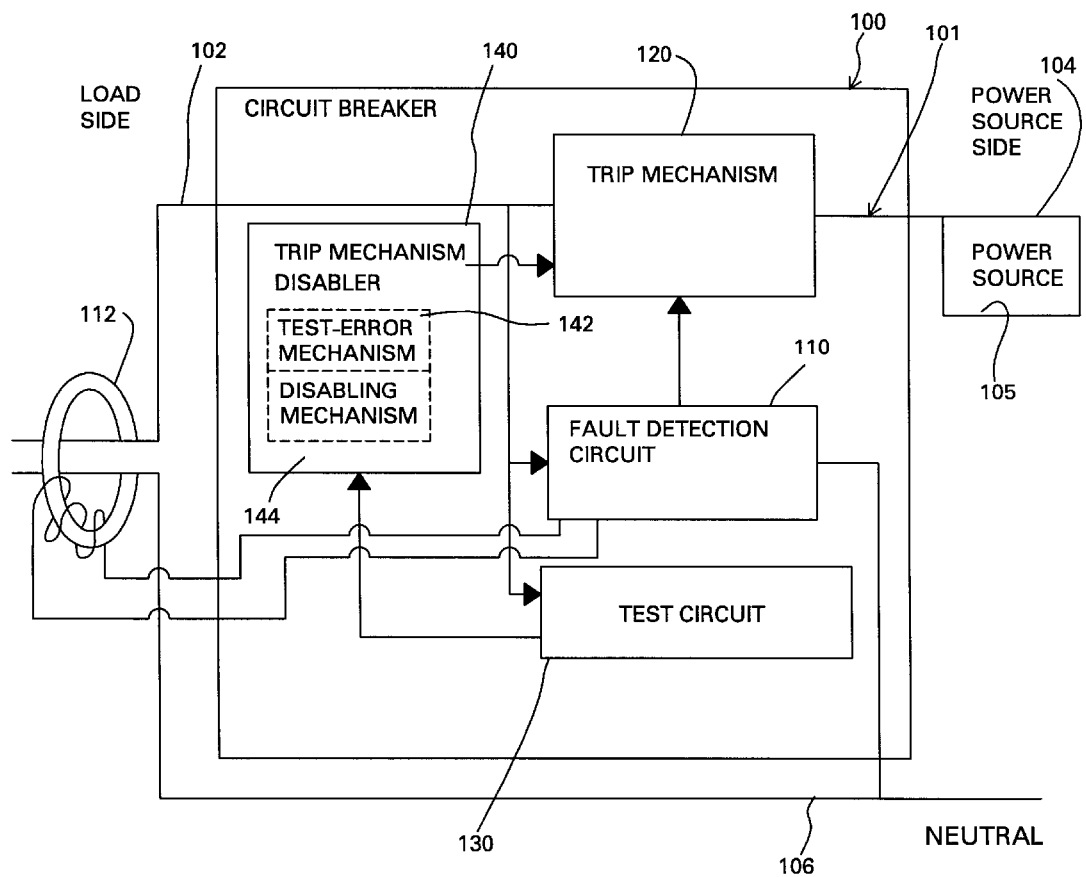
FIG. 1 is a block diagram of one exemplary embodiment of a fail-safe electronic circuit breaker.

As shown in FIG. 1, a fail-safe electronic circuit breaker 100 is connected to a line conductor 101 between a load side 102 and a power source side 104. In one representative embodiment, a power source 105 is connected to the power source side 104 of the line conductor 101 and provides an alternating current (AC) power to the load (not shown), such as, for example, an appliance, via the fail-safe electronic circuit breaker 100. In FIG. 1, the fail-safe electronic circuit breaker 100 includes a trip mechanism 120 that is connected to the load side 102 and the power source side 104 of the line conductor 101. The trip mechanism 120 is connected to a fault detection circuit 110 that comprises various electronic circuits (not shown) that have the capability of detecting various circuit faults, such as, for example, ground faults, ground-neutral connection faults and arc circuit faults. The fault detection circuit 110 is also connected to the line conductor 101, a neutral conductor 106 and a current transformer 112. As discussed above, the fault detection circuit 110 is connected to the current transformer 112 to sense the difference in current flowing through the line conductor 101 and the neutral conductor 106. It should be appreciated that, in other representative embodiments, the current transformer 112 can be included in the fault detection circuit 110. When the fault detection circuit 110 detects a circuit fault, the trip mechanism 120 trips and/or causes an open circuit condition between the power source side 104 and the load side 102 of the line conductor 101 causing the current flow to be interrupted. It should be appreciated that in other representative embodiments the fault detection circuit 110 can be included in the trip mechanism 120. In one representative embodiment, the trip mechanism 120 can comprise a bi-metal strip 444 (FIGS. 4 and 5) that moves and/or bends in response to an excessive current flow and causes the fail-safe circuit breaker 100 to prevent current flow between the power source side 104 and the load side 102 of the line conductor 101. In another representative embodiment, the trip mechanism 120 can comprise electronic circuitry connected to a solenoid (not shown) that work to cause the fail-safe circuit breaker 100 to prevent current flow between the power source side 104 and the load side 102 of the line conductor 101.

A test circuit 130 is connected to the line connector 101 and fault detection circuit 110. In another representative embodiment, the test circuit 130 is not directly connected to the line conductor 101 and can be connected indirectly via a connection to the trip mechanism 120 and/or the fault detection circuit 110. The test circuit 130 selectively produces a simulated circuit fault that is provided to the fault detection circuit 110. In one representative embodiment, the test circuit 130 selectively produces a simulated circuit fault when a push to test switch (not shown) is pushed by a user or repair personnel. It should be appreciated that a simulated circuit fault produces the electrical characteristics that identify a circuit fault, such as, for example, a ground fault, a ground-neutral fault or arc circuit fault. In addition, when the simulated circuit fault is produced, the fault detection circuit 110 should not be able to determine that the circuit fault is simulated, thus, the simulated circuit fault are treated as genuine circuit fault by the fault detection circuit 110. In one representative embodiment, the test circuit 130 comprises a switch (not shown) connected to the line conductor 101 and a resistor (not shown) that produces a current flow in a primary winding of the current transformer 112 that is above a predetermined current level. When properly operating, the fault detection circuit 110 will detect the simulated circuit fault and cause the trip mechanism 120 to trip and current flow will be interrupted between the power source side 104 and the load side 102 of the line conductor 101. In another representative embodiment, a reset switch (not shown) can be turned by the user or repair personnel to reset the trip mechanism 120 of the fail-safe electronic circuit breaker 100 to re-establish and current flow between the power source side 104 and the load side 102 of the line conductor 101.

Figure 5:
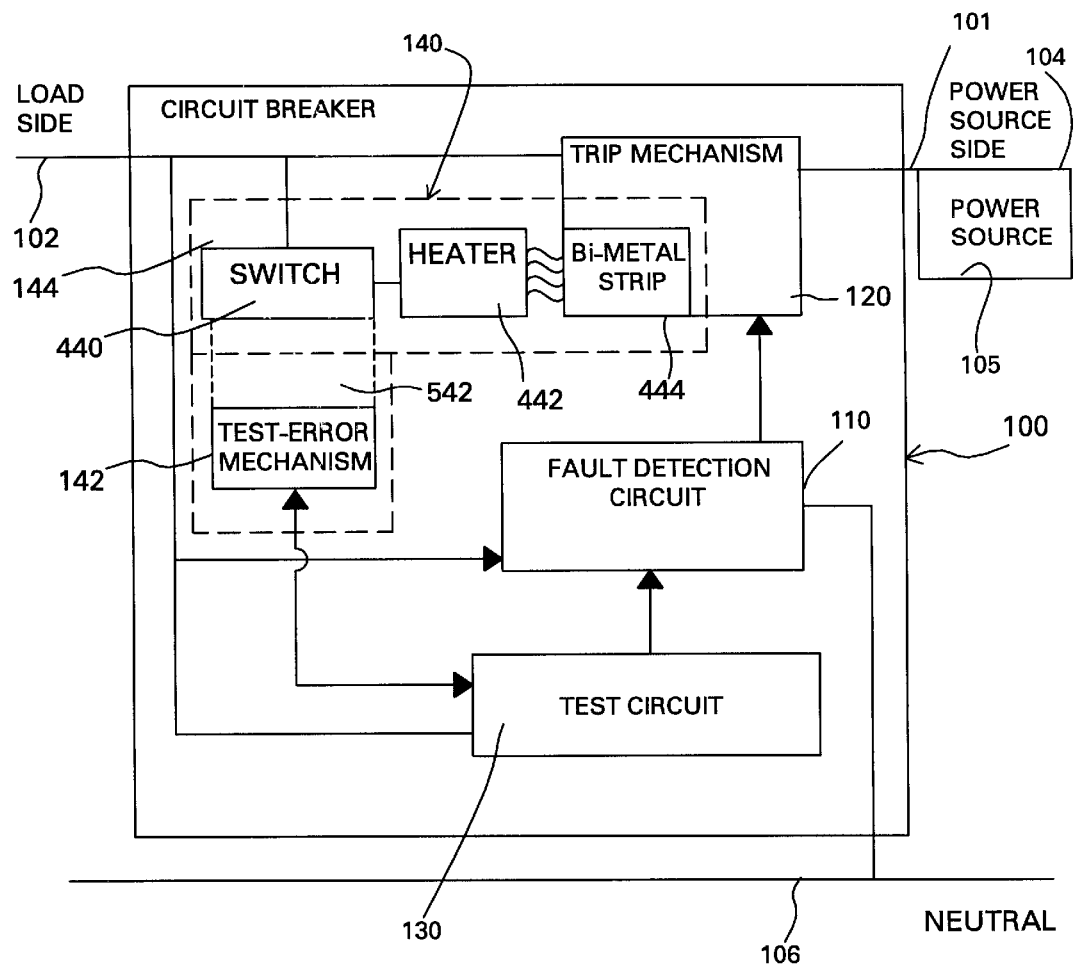
FIG. 5 is a block diagram of an exemplary embodiment of a fail-safe electronic circuit braker including a heating element and a test-error mechanism in a second position.

A trip mechanism disabler 140 is connected to the test circuit 130. In other representative embodiments, the trip mechanism disabler 140 can be connected to the trip mechanism 120, the power source side 104 of the line conductor 101 and/or the fault detection circuit 110. The trip mechanism disabler 140 includes a test-error mechanism 142 and disabling mechanism 144. The test-error mechanism 142 determines when the fault detection circuit 110 has failed to detect a simulated circuit fault produced by the test circuit 130. In one representative embodiment, the test-error mechanism 142 determines if the fault detection circuit 110 fails to detect a simulated fault within a predetermined amount of time after being produced by the test circuit 130. In another representative embodiment, the test-error mechanism 142 is capable of being in at least a first position and a second position. If the fault detection circuit 110 detects the simulated circuit faults within the predetermined amount of time after being produced by the test circuit 130, the test-error mechanism 142 will remain in the first position. However, if the fault detection circuit 110 fails to detect the simulated circuit fault within the predetermined amount of time after being produced by the test circuit 130, the test-error mechanism 142 is irreversible placed or rendered in the second position. In even another representative embodiment, the second position comprises an elongation of the test-error mechanism 142 when compared to the first position. The elongation of the test-error mechanism 142 can comprise, for example, a first elongated portion 342 (FIG. 3) or a second elongated portion 542 (FIG. 5).

In the event that the fault detection circuit 110 fails to detect a simulated circuit fault produced by the test circuit 130, the test-error mechanism 142 will determine that the simulated circuit fault was undetected. As a result, the test-error mechanism 142 directs the disabling mechanism 144 to irreversibly disable the fail-safe electronic circuit breaker 100. In one representative embodiment, irreversibly disabling the fail-safe electronic circuit breaker 100 is accomplished by the disabling mechanism 144 and the test-error mechanism 142 causing the trip mechanism 120 to trip the fail-safe electronic circuit breaker 100. The trip mechanism 120 can be reset, but the trip mechanism disabler 140 will again cause the trip mechanism 120 to trip the fail-safe electronic circuit breaker 100. It should be appreciated that, in other representative embodiments, irreversibly disabling the fail-safe electronic circuit breaker 100 will cause a permanent disruption in the current flow between the power supply side 104 and the load side 102 of the line conductor 101, and the current flow can only be permanently re-established by replacing the fail-safe electronic circuit breaker 100.

Figure 2:
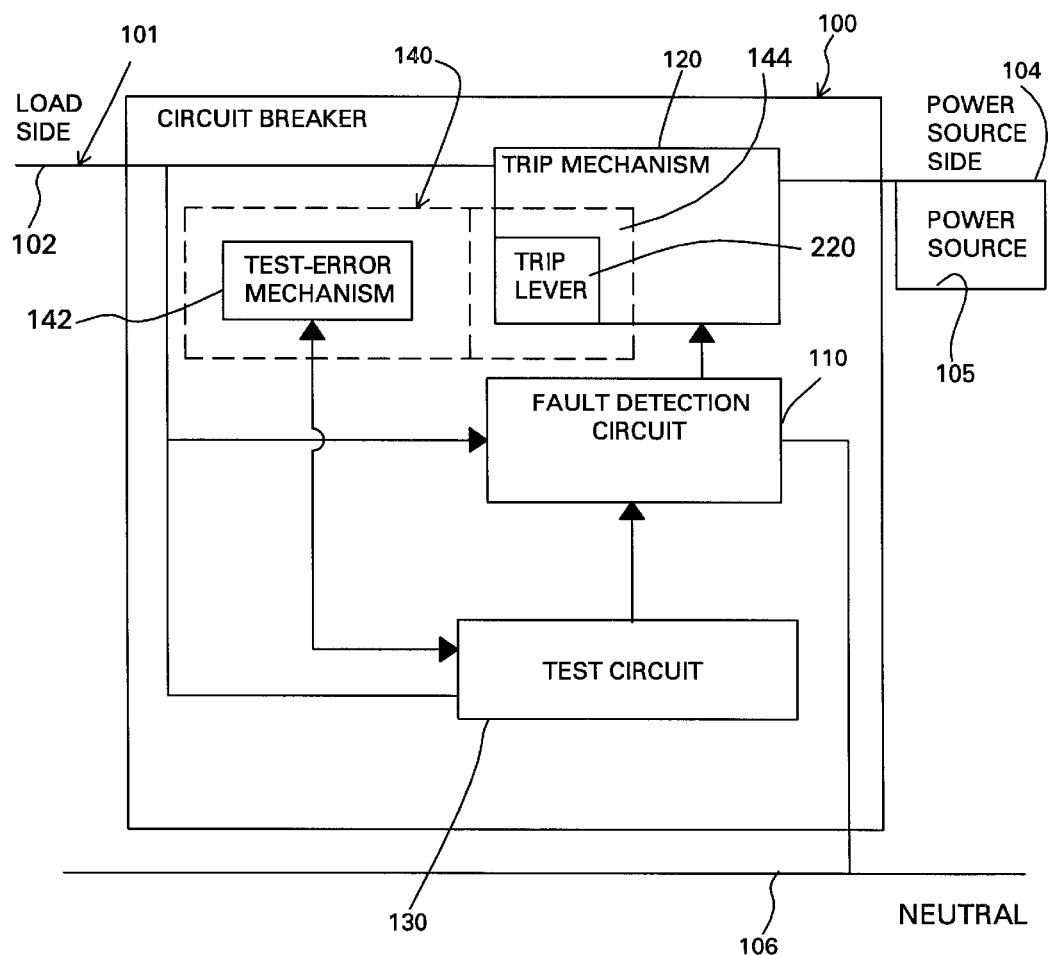
FIG. 2 is a block diagram of an exemplary embodiment of a fail-safe electronic circuit breaker including a trip lever and a test-error mechanism in a first position.

In one representative embodiment, as shown in FIG. 2, the trip mechanism disabler 140 comprises a test-error mechanism 142 and a disabling mechanism 144. The trip mechanism 120 comprises a trip lever 220. In one representative embodiment, the trip lever 220 comprises a mechanical switching mechanism connected to, for example, a solenoid (not shown) of the trip mechanism 120. The disabling mechanism 144 also includes the trip level 220. It should be appreciated that, in other representative embodiments, the trip lever 220 can be located externally from the trip mechanism 120 and connected to the trip mechanism 120 via conductors or mechanical-type connections (not shown). As such, in FIG. 2, the fault detection circuit 110 has detected any simulated circuit faults generated by the test circuit 130 because the test-error mechanism 142 remains in the first position.

Figure 3:
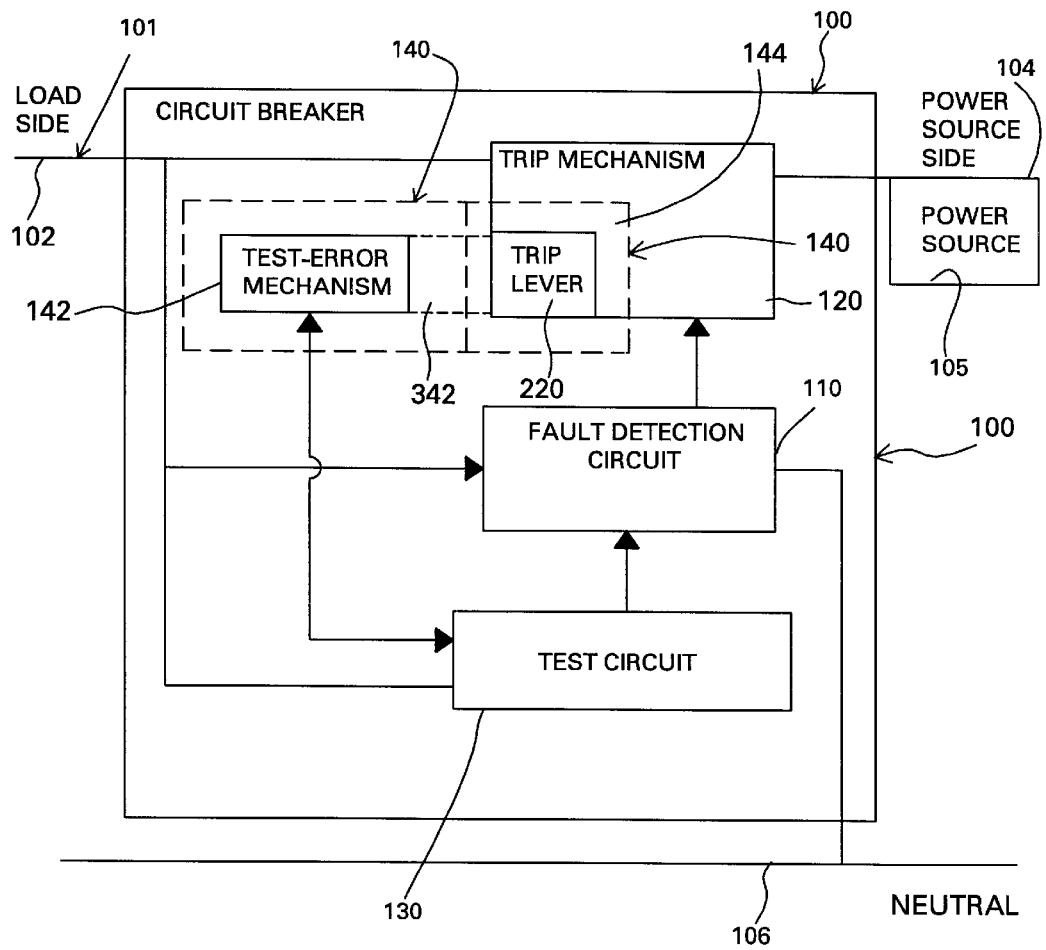
FIG. 3 is a block diagram of an exemplary embodiment of a fail-safe electronic circuit reaker including a trip lever and a test-error mechanism in a second position.

In FIG. 3, the test-error mechanism 142 is shown in the second position. As discussed herein above, when the fault detection circuit 110 fails to detect a simulated circuit fault within a predetermined amount of time of being produced by the test circuit 130, the test-error mechanism 142 irreversibly enters or is rendered in the second position. In one representative embodiment, shown in FIG. 3, when in the second position, the test-error mechanism 142 becomes elongated via the first elongated portion 342. In the second position, the first elongated portion 342 allows the test-error mechanism 142 to contact the trip lever 220. This contact causes the trip mechanism 120 to trip the fail-safe electronic circuit breaker 100. Since the test-error mechanism 142 irreversibly enters or is rendered in the second position, the fail-safe electronic circuit breaker 100 cannot be reset after tripping. If a user or repair personnel attempts to reset the fail-safe electronic circuit breaker 100, the test-error mechanism will still be in contact with the trip lever 220 and the fail-safe electronic circuit breaker 100 will immediately trip again. Thus, the fail-safe electronic circuit breaker 100 is permanently and irreversibly disabled after the fault detection circuit 110 fails to detect a simulated circuit fault within a predetermined amount of time after being generated by the test circuit 130.

Figure 4:
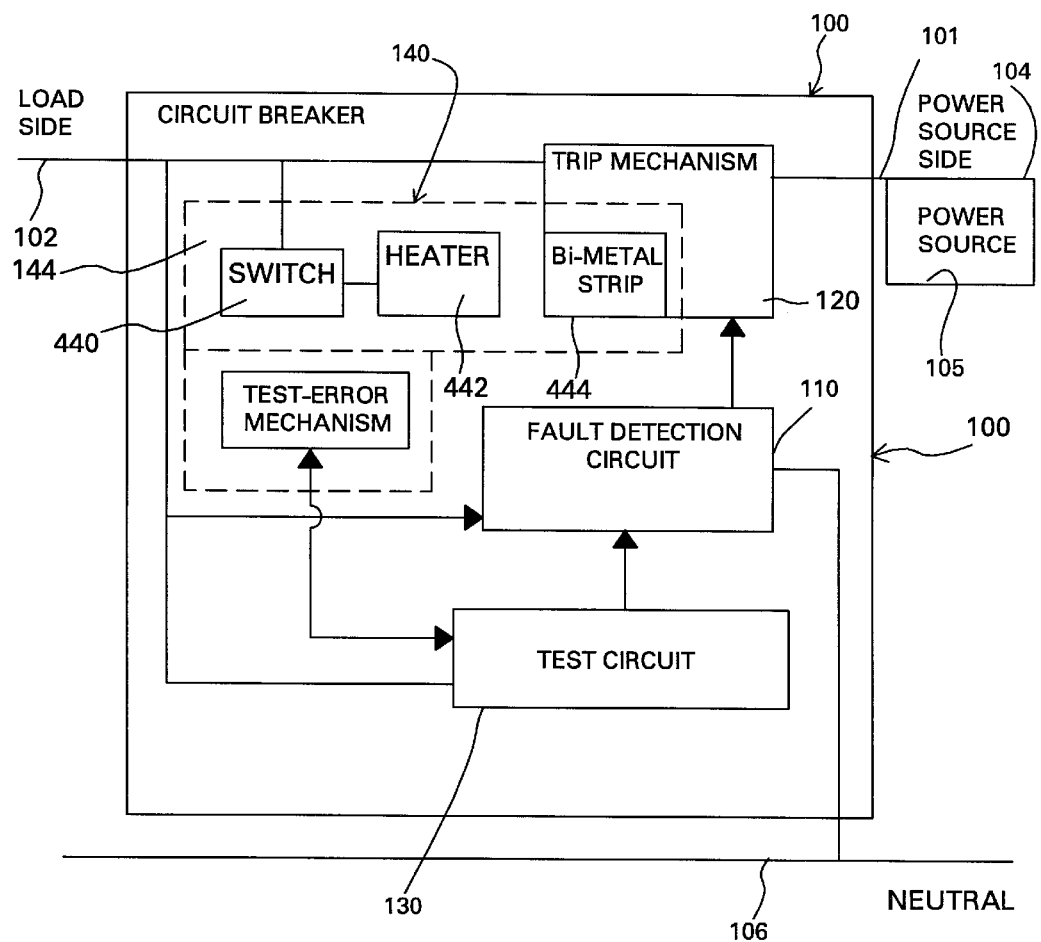
FIG. 4 is a block diagram of an exemplary embodiment of a fail-safe electronic circuit maker including a heating element and a test-error mechanism in a first position.

In another representative embodiment, as shown in FIG. 4, the trip mechanism disabler 140 includes, at least, a test-error mechanism 142 and a disabling mechanism 144. The disabling mechanism 144 includes a heating element 442 connected to a first switch 440. The heating element 442 is positioned closely proximate to a bimetallic strip 444 of the trip mechanism 140. The first switch 440 is connected to power source 105 via the line conductor 101 in a downstream configuration from the trip mechanism 120. In other representative embodiments, it should be appreciated that the bi-metal strip 444 can be a portion of the trip mechanism 120, and in another representative embodiment, the bi-metal strip 444 can be located externally from the trip mechanism 120. In FIG. 4, the test-error mechanism 142 is shown in the first position. It should be appreciated that, in FIG. 4, the fault detection circuit 110 has detected any simulated circuit faults within the predetermined amount of time after being generated by the test circuit 130. It should also be appreciated that in the first position, the test-error mechanism 142 does not contact the first switch 440, and therefore, the first switch 440 does not conduct current and/or power to the heating element 442.

In FIG. 5, the test-error mechanism 142 is shown in the second position. As described herein above, the test-error mechanism 142 irreversibly enters or is rendered in the second position when the fault detection circuit 110 fails to detect a simulated circuit fault within a predetermined amount of time after being generated by the test circuit 130. In the second position, the test-error mechanism 142 is elongated via the second elongated portion 542, and the test-error mechanism 142 contacts the first switch 440. When the test-error mechanism 142 contacts the first switch 440, the first switch 440 causes current to flow from the power source 105 via line conductor 101 to the heating element 442. The current flow causes the heating element 442 to generate heat. It should be appreciated that the heating element 442 can comprise, for example, an electric heating element, a metallic heating element and/or an electrically resistive element that generates heat in response to a flowing current or voltage, and any other suitable device that can generate heat in response to electric current, voltage or power. In even another representative embodiment, the heating element 442 can comprise a coil (not shown) that is wrapped around the bi-metal strip 444.

Since the heating element, 442 is in close proximity to the bimetallic strip 444 of the trip mechanism 120, the heat generated by the heating element 442 heats the bimetallic strip 444. In one representative embodiment, the bimetallic strip 444 comprises two metals having different thermal expansion properties. Therefore, as a result of being heated, the bimetallic strip 444 is caused to move and/or bend. The moving and/or bending of the bimetallic strip 444 causes the bimetallic strip 444 to trip the trip mechanism 120 of the fail-safe electronic circuit breaker 100. It should be appreciated that in another representative embodiment, the bimetallic strip 444 could contact the trip mechanism 120 or a portion thereof, such as, for example, the trigger lever 220 (FIGS. 2 and 3) and cause the fail-safe electronic circuit breaker 100 to trip, and therefore, the second switch 446 would not be used in this representative embodiment.

After the fail-safe electronic circuit breaker 100 trips, the current flow between the load side 102 and the power source side 104 of the line conductor 101 is interrupted. In addition, since the heating element 442 is connected in a downstream configuration with reference to the fail-safe electronic circuit breaker 100, current is also interrupted to the heating element 442 when the test-error mechanism 142 is in the second position. Therefore, the bimetallic strip 44 is allowed to cool and to retain a shape such that the bimetallic strip 444 no longer contacts the second switch 446. As a result, a user or repair personnel can reset the fail-safe electronic circuit breaker 100 after it trips. However, since the test error mechanism 142 has irreversibly entered or been rendered in the second position, power and/or current flow will also be supplied to the heating element 442 since the test-error mechanism 142 will contact the first switch 440. As such, the heating element 442 will again heat the bimetallic strip 444 and the bimetallic strip 444 will cause the trip mechanism 120 of the fail-safe electronic circuit breaker 100 to trip. It should be appreciated that the heating element 442 and the bimetallic strip 444 can be chosen such that the fail-safe electronic circuit breaker 100 trips after bimetallic strip 444 has been heated for a predetermined time. As such, the fail-safe electronic circuit breaker 100, as shown in FIGS. 4 and 5, is permanently disabled after the fault detection circuit 110 fails to detect a simulated circuit fault within a predetermined amount of time after being generated by the test circuit 130.

Figure 6:
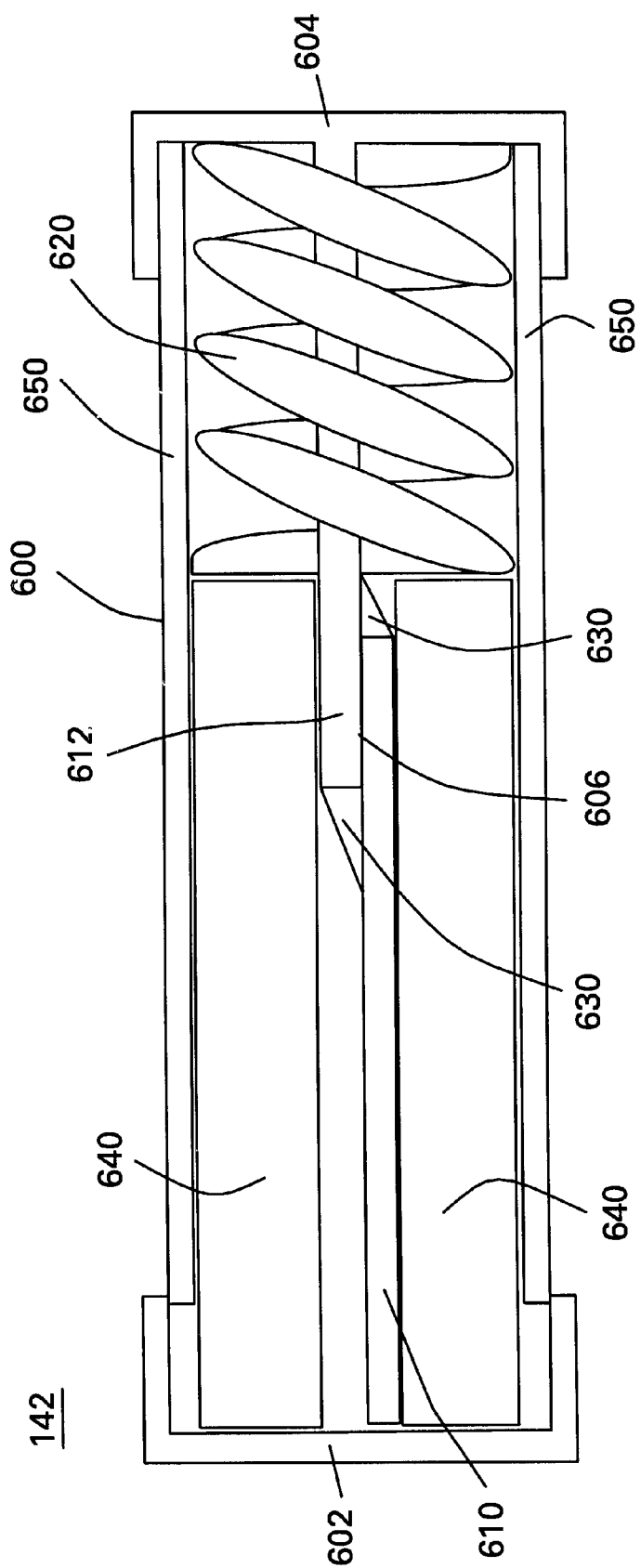
FIG. 6 is a ross-sectional view of one exemplary embodiment of a test-error mechanism a first position.
Figure 7:
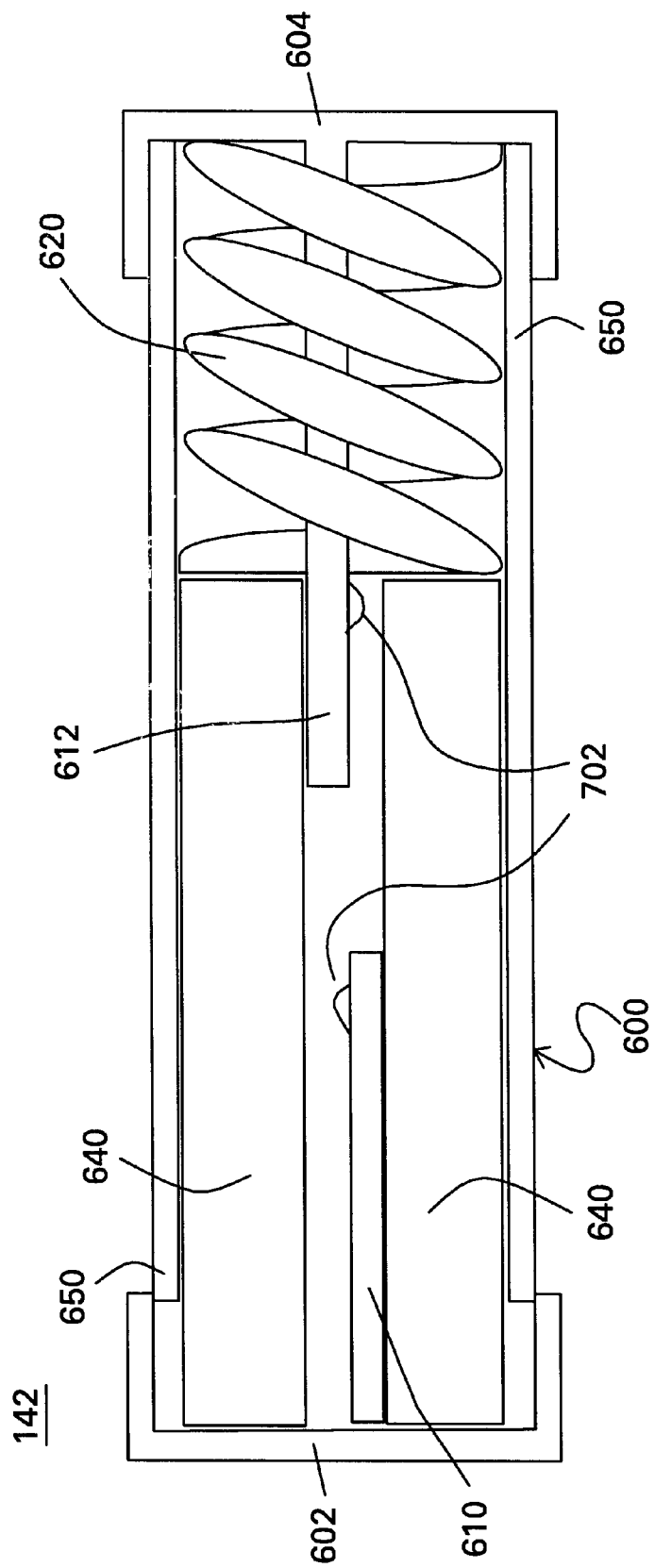
FIG. 7 is a cross-sectional view of one exemplary embodiment of a test-error mechanism in a second position.

As shown in FIGS. 6 and 7, one representative embodiment of the test-error mechanism 142 includes a fusible link 600. In FIG. 6, the fusible link 600 (and thus the test-error mechanism 142) is in the first position. In FIG. 7, the fusible link 600 (and thus the test-error mechanism 142) is in the second position. In this representative embodiment, the fusible link 600 includes a housing 650 that is positioned between the first end 602 and a second end 604. In one representative embodiment, the first end 602 and the second end 604 are composed of a electrically conductive material. In the housing 650, a first conductive member 610 is connected to the first end 602 and a second conductive member 612 is connected to the second end 604. In one representative embodiment, at least one of the first conductive member 610 and the second conductive member 612 comprise an electrically resistive material. A connection 630 connects the first conductive member 610 and the second conductive member 612 to render the fusible link 600 (and thus the test-error mechanism 142) in the first position. A spring 620 is biased against the second end 604 by the spacer 640 when the fusible link 600 (and thus the test-error mechanism 142) is in the first position. In a representative embodiment, the connection 630 comprises solder. In another representative embodiment, the connection 630 comprises a low temperature melting point solder. In even another representative embodiment, the connection 630 comprises a material having a melting point between about 200° C. to about 300° C. In yet another representative embodiment, the connection 630 comprises a thermoplastic glue and/or polypropylene.

When the fusible link 600 is included in the fail-safe electronic circuit breaker 100 as the test-error mechanism 142, the test circuit 130 supplies current from the power source side 104 of the line conductor 101 to the fusible link 600 when a simulated circuit fault is generated and supplied to the fault detection circuit 110 for analysis. In addition, the current is continuously supplied to the fusible link 600 until the fault detection circuit 110 detects the simulated circuit fault and the fail-safe electronic circuit breaker 100 is caused to trip. The fusible link 600 supplies the current through the connection 630 via the first end 602, the first conductive member 610, the second conductive member 612 and the second end 604. As discussed above, in one representative embodiment, the connection 630 comprises solder having a material composition that causes the connection 630 to liquefy in the presence of a current flow after a predetermined amount of time to break the connection between the first conductive member 610 and the second conductive member 612. In another representative embodiment, connection 630 comprises a low temperature melting point solder. In addition, in even another representative embodiment, the connection 630 comprises a material having a melting point between about 200° C. to about 300° C. In yet another representative embodiment, the connection 630 comprises a thermoplastic glue and/or polypropylene. In this representative embodiment, at least one of the first conductive member 610 and the second conductive member 612 are composed of an electrically resistive material that generates heat in response to a current flow. Therefore, the current flowing through the first conductive member 610 and the second conductive member 612 creates heat that causes the connection 630 to liquefy. It should be appreciated that, in one representative embodiment, where the connection 630 comprises a thermoplastic glue that is not electrically conductive, the first conductive member 610 and the second conductive member 612 can be electrically connected via a contact area 606 that comprises a close surface contact between the first conductive member 610 and the second conductive member 612. It should also be appreciated that the first conductive member 610 and the second conductive member 612 can be comprised of an electrically resistive material. In one representative embodiment, the predetermined amount of time is between about thirty (30) milliseconds (ms) and about six hundred (600) milliseconds (ms). In another representative embodiment, the predetermined amount of time is greater than about sixteen (16) milliseconds (ms). In even another representative embodiment, the predetermined amount of time is between about sixteen (16) milliseconds (ms) and six hundred (600) milliseconds (ms).

Once the connection 630 has been liquefied, the biased spring 620 is allowed to expand. As a result, the spacer 640 causes the first end 602 to become elongated and the spring 620 causes the second end 604 to become elongated. It should be appreciated that the amount of elongation experience by the fusible link 600 (and thus the test-error mechanism 142) is at least dependent upon the spring constant of the spring 620. When the connection 630 has been liquefied, the first conductive member 610 may not contact the second conductive member 612. When the connection 630 is liquefied, the fusible link 600 (and thus the test-error mechanism 142) is irreversibly caused to enter and/or be rendered in the second position. Therefore, the disabling mechanism 144 permanently disables the fail-safe electronic circuit breaker 100 when the fault detection circuit 110 fails to detect a simulated circuit fault within a predetermined amount of time.

Figure 8:
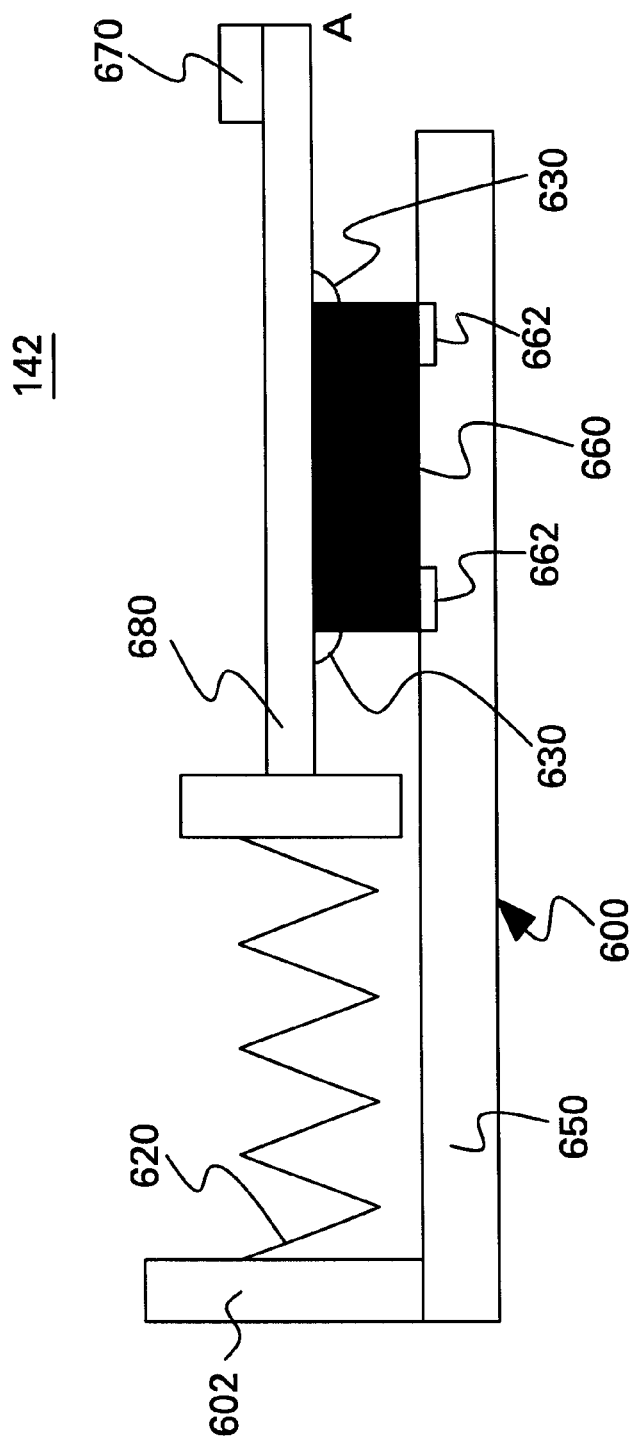
FIG. 8 is a cross-sectional view of another exemplary embodiment of a test-error mechanism in a first position.
Figure 9:
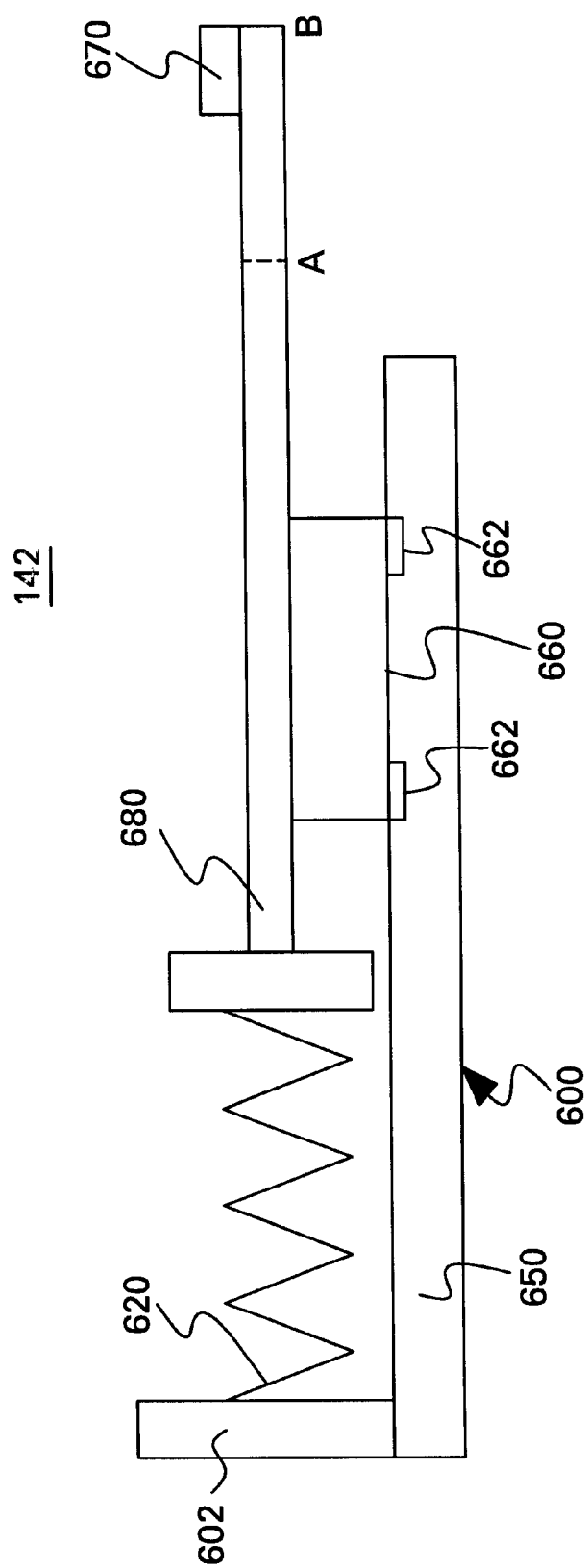
FIG. 9 is cross-sectional view of another exemplary embodiment of a test-error mechanism in a second position.

In another representative embodiment of the test-error mechanism 142, shown in FIGS. 8 and 9, the test-error mechanism 142 comprises a fusible link 600. A plunger 680 is connected to a spring 620 that is connected a first end 602 to housing 650. The plunger 680 is positioned proximate to a resistor 660 having contacts 662 that are selectively connected to the line conductor 101 when the fault detection circuit 110 fails to detect a simulated circuit fault within a predetermined time of being produced by the test circuit 130. It should be appreciated that, in other representative embodiments, the resistor 660 can comprise any element that produces heat in response to a current flow. In FIG. 8, the plunger is maintained in position A by a connection 630 that causes the spring 620 to be biased. It should be appreciated that, in one representative embodiment, the connection 630, can comprise solder. In another representative embodiment, the connection 630 comprises a low temperature melting point solder. In even another representative embodiment, the connection 630 comprises a material having a melting point between about 200° C. to about 300° C. IN yet another representative embodiment, the connection 630 comprises a thermoplastic glue and/or polypropylene. In addition, an indicator 670 is provided to indicate when the fail-safe circuit breaker 100 has been permanently disabled because the fault detection circuit 110 failed to detect a simulated circuit fault with a predetermined time after being produced by the test circuit 130.

In FIG. 9, the fault detection circuit 110 has failed to detect a simulated circuit fault within a predetermined time after being produced by the test circuit 130. As a result, a current flow has passed through the resistor 660 that has caused heat to be generated. The heat generated by the resistor 660 caused the connection 630 to liquefy and/or break. Therefore, the biased spring 620 moves the plunger 680 from position A to position B. The movement of the plunger 680 from position A to position B is represented in other representative embodiments discussed above as the first elongated portion 342 and the second elongated portion 542. It should be appreciated that the movement of the plunger 680 also moves the indicator 670. As such, the movement of the plunger 680 can cause the indicator 680 to be moved to a window (not shown) in the fail-safe circuit breaker 100 such that a user and/or repair personnel can determine when the fail-safe circuit breaker 100 has been permanently disabled.

The foregoing discussion of the invention has been presented for purposes of illustration and description. Further, the description is not intended to limit the invention to the form disclosed herein. Consequently, variations and modifications commensurate with the above teachings, with the skill and knowledge of the relevant art, are within the scope of the present invention. The representative embodiments described herein above are further intended to explain the best mode presently known of practicing the invention and to enable others skilled in the art to utilize the invention as such, or in other representative embodiments, and with the various modifications required by their particular application or uses of the invention. It is intended that the appended claims be construed to include alternative embodiments to the extent permitted by the prior art.

What is claimed is:

1. A fail-safe electronic circuit breaker comprising:
   a fault detection circuit for detecting a circuit fault;
   a test circuit connected to the fault detection circuit, the test circuit selectively generating a simulated circuit fault;
   a trip mechanism connected to the fault detection circuit and the test circuit, the trip mechanism tripping the fail-safe electronic circuit breaker when the circuit fault is detected by the fault detection circuit; and
   a trip mechanism disabler connected to the trip mechanism and the test circuit, the trip mechanism disabler permanently disabling the trip mechanism when the fault detection circuit fails to detect the simulated circuit fault after about a predetermined amount of time.

2. The fail-safe electronic circuit breaker of claim 1 wherein the trip mechanism disabler comprises:
   a test-error mechanism connected to the test circuit, the test-error mechanism having at least a first position and a second position wherein the test-error mechanism irreversibly enters the second position when the fault detection circuit fails to detect the simulated circuit fault after about the predetermined amount of time.

3. The fail-safe electronic circuit breaker of claim 1 wherein the trip mechanism comprises a trip lever connected to the fault detection circuit for tripping the fail-safe electronic circuit breaker when a circuit fault is detected by the fault detection circuit; and
   the trip mechanism disabler comprises a test-error mechanism connected to the test circuit and the trip mechanism, the test-error mechanism having at least a first position and a second position, the test-error mechanism irreversibly entering the second position when the fault detection circuit fails to detect the simulated circuit fault after about the predetermined amount of time, the test-error mechanism contacting the trip lever when in the second position and the trip lever permanently disabling the trip mechanism when the test-error mechanism is in the second position.

4. The fail-safe electronic circuit breaker of claim 3 wherein test-error mechanism comprises:
   a fusible link connected to and retaining a first end and a second end of the test-error mechanism in the first position wherein the fusible link liquefies when the fault detection circuit fails to detect the simulated circuit fault after about the predetermined amount of time; and
   a bias member positioned between the first end and the second end, the bias member placing the test-error mechanism in the second position when the fusible link is liquefied.

5. The fail-safe electronic circuit breaker of claim 1 wherein the predetermined amount of time is between about thirty milliseconds to amount six hundred milliseconds.

6. The fail-safe electronic circuit breaker of claim 1 wherein the predetermined amount of time is greater than about sixteen milliseconds.

7. The fail-safe electronic circuit breaker of claim 4 wherein the fusible link comprises:
   a first conductive member connected to the first end of the test-error mechanism;
   a second conductive member connected to the second end of the test-error mechanism;
   a connection connecting the first conductive member and the second conductive member and maintaining the test-error mechanism in the first position, the connection being liquefied when the fault detection circuit fails to detect the simulated circuit fault after about the predetermined amount of time; and
   a spring positioned between the first end and the second end, the spring placing the test-error mechanism in the second position when the connection is liquefied.

8. The fail-safe electronic circuit breaker of claim 4 wherein the fusible link comprises:
   a spring connected to a first end of the fusible link;
   a plunger connected to the spring;
   an electrically resistive member positioned proximate to the plunger for generating heat in the presence of a flowing current; and
   a connection connecting the plunger and the electrically resistive member and maintaining the test-error mechanism in a first position, the connection being liquefied when the fault detection circuit fails to detect the simulated circuit fault after about the predetermined amount of time, the spring placing the test-error mechanism in the second position when the connection is liquefied.

9. The fail-safe electronic circuit breaker of claim 8 wherein the connection comprises a material having a melting point between about 200° C. to about 300° C.

10. The fail-safe electronic circuit breaker of claim 8 wherein the connection comprises solder.

11. The fail-safe electronic circuit breaker of claim 8 further comprising an indicator connected to the plunger indicating when the test-error mechanism is in the second position.

12. The fail-safe electronic circuit breaker of claim 1 wherein the trip mechanism disabler further comprises:
   a test-error mechanism connected to the test circuit and the trip mechanism, the test-error mechanism having at least a first position and a second position wherein the test-error mechanism irreversibly enters the second position when the fault detection circuit fails to detect the simulated fault after about a predetermined time;

a heating element connected to a power source and emitting heat when the test-error mechanism is in the second position; and a bi-metallic strip positioned proximate to the heating element, the bimetallic strip having at least a first state and a second state wherein the bimetallic strip enters the second state after being heated by the heating element and the bi-metallic strip contacting the trip mechanism when in the second state to cause the fail-safe electronic circuit breaker to trip and permanently disable the trip mechanism.

13. The fail-safe electronic circuit breaker of claim 12 wherein test-error mechanism comprises:

a fusible link connected to and retaining a first end and a second end of the test-error mechanism in the first position wherein the fusible link liquefies when the fault detection circuit fails to detect the simulated circuit fault after about the predetermined amount of time; and a bias member positioned between the first end and the second end, the bias member placing the test-error mechanism in the second position when the fusible link is liquefied.

14. The fail-safe electronic circuit breaker of claim 13 wherein the predetermined amount of time is between about thirty milliseconds to amount six hundred milliseconds.

15. The fail-safe electronic circuit breaker of claim 13 wherein the predetermined amount of time is greater than about sixteen milliseconds.

16. The fail-safe electronic circuit breaker of claim 13 wherein the fusible link comprises:

a first conductive member connected to the first end of the test-error mechanism;

a second conductive member connected to the second end of the test-error mechanism;

a connection connecting the first conductive member and the second conductive member and maintaining the test-error mechanism in the first position, the connection being liquefied when the fault detection circuit fails to detect the simulated circuit fault after about the predetermined amount of time; and a spring positioned between the first end and the second end, the spring placing the test-error mechanism in the second position when the connection is liquefied.

17. The fail-safe electronic circuit breaker of claim 13 wherein the fusible link comprises:

a spring connected to a first end of the fusible link;

a plunger connected to the spring;

an electrically resistive member positioned proximate to the plunger for generating heat in the presence of a flowing current; and a connection connecting the plunger and the electrically resistive member and maintaining the test-error mechanism in a first position, the connection being liquefied when the fault detection circuit fails to detect the simulated circuit fault after about the predetermined amount of time, the spring placing the test-error mechanism in the second position when the connection is liquefied.

18. The fail-safe electronic circuit breaker of claim 17 wherein the connection comprises a material having a melting point between about 200° C. to about 300° C.

19. The fail-safe electronic circuit breaker of claim 17 wherein the connection comprises solder.

20. The fail-safe electronic circuit breaker of claim 17 further comprising an indicator connected to the plunger indicating when the test-error mechanism is in the second position.

21. The fail-safe electronic circuit breaker of claim 1 wherein the predetermined amount of time is between about thirty milliseconds to amount six hundred milliseconds.

22. The fail-safe electronic circuit breaker of claim 1 wherein the predetermined amount of time is greater than about sixteen milliseconds.

23. A fail-safe electronic circuit breaker comprising:

a fault detection circuit for detecting a circuit fault;

a test circuit connected to the fault detection circuit, the test circuit selectively generating a simulated circuit fault;

a trip mechanism connected to the fault detection circuit and the test circuit, the trip mechanism comprising a trip lever connected to the fault detection circuit for tripping the fail-safe electronic circuit breaker when a circuit fault is detected by the fault detection circuit;

a test-error mechanism connected to the test circuit and the trip mechanism, the test-error mechanism having at least a first position and a second position, the test-error mechanism comprising:

a fusible link connected to the test circuit and the trip mechanism, the fusible link retaining a first end and a second end of the test-error mechanism in the first position wherein the fusible link liquefies when the fault detection circuit fails to detect the simulated circuit fault after about the predetermined amount of time; and a bias member positioned between the first end and the second end, the bias member placing the test-error mechanism in the second position when the fusible link is liquefied, wherein the test-error mechanism contacts the trip lever when in the second position and the trip lever permanently disabling the trip mechanism when the test-error mechanism is in the second position.

24. The fail-safe electronic circuit breaker of claim 23 wherein the predetermined amount of time is between about thirty milliseconds to amount six hundred milliseconds.

25. The fail-safe electronic circuit breaker of claim 23 wherein the predetermined amount of time is greater than about sixteen milliseconds.

26. The fail-safe electronic circuit breaker of claim 23 wherein the fusible link comprises:

a first conductive member connected to the first end of the test-error mechanism;

a second conductive member connected to the second end of the test-error mechanism;

a connection connecting the first conductive member and the second conductive member and maintaining the test-error mechanism in the first position, the connection being liquefied when the fault detection circuit fails to detect the simulated circuit fault after about the predetermined amount of time; and a spring positioned between the first end and the second end, the spring placing the test-error mechanism in the second position when the connection is liquefied.

27. The fail-safe electronic circuit breaker of claim 23 wherein the fusible link comprises:

a spring connected to a first end of the fusible link;

a plunger connected to the spring;

an electrically resistive member positioned proximate to the plunger for generating heat in the presence of a flowing current; and a connection connecting the plunger and the electrically resistive member and maintaining the test-error mechanism in a first position, the connection being liquefied when the fault detection circuit fails to detect the simulated circuit fault after about the predetermined amount of time, the spring placing the test-error mechanism in the second position when the connection is liquefied.

28. The fail-safe electronic circuit breaker of claim 27 wherein the connection comprises a material having a melting point between about 200° C. to about 300° C.

29. The fail-safe electronic circuit breaker of claim 27 wherein the connection comprises solder.

30. The fail-safe electronic circuit breaker of claim 27 further comprising an indicator connected to the plunger indicating when the test-error mechanism is in the second position.

31. A fail-safe electronic circuit breaker having a fault detection circuit connected to a test circuit selectively generating a simulated circuit fault, the fail-safe electronic circuit breaker comprising:

a fault detection circuit for detecting a circuit fault;

a test circuit connected to the fault detection circuit, the test circuit selectively generating a simulated circuit fault;

a trip mechanism connected to the fault detection circuit and the test circuit, the trip mechanism tripping the fail-safe electronic circuit breaker when a circuit fault is detected by the fault detection circuit; and a test-error mechanism connected to the test circuit and the trip mechanism, the test-error mechanism having at least a first position and a second position, the test-error mechanism comprising:

a fusible link connected to the test circuit and retaining a first end and a second end of the test-error mechanism in the first position wherein the fusible link liquefies when the fault detection circuit fails to detect the simulated fault after about the predetermined amount of time;

a bias member positioned between the first end and the second end, the bias member placing the test-error mechanism in the second position when the fusible link is liquefied;

a heating element connected to a power source and emitting heat when the test-error mechanism is in the second position; and a bimetallic strip positioned proximate to the heating element, the bi-metallic strip having at least a first state and a second state wherein the bimetallic strip enters the second state after being heated by the heating element and the bi-metallic strip causing the trip mechanism to trip the fail-safe electronic circuit breaker when in the second state and permanently disabling the trip mechanism.

32. The fail-safe electronic circuit breaker of claim 31 wherein the predetermined amount of time is between about thirty milliseconds to about six hundred milliseconds.

33. The fail-safe electronic circuit breaker of claim 31 wherein the predetermined amount of time is greater than about sixteen milliseconds.

34. The fail-safe electronic circuit breaker of claim 31 wherein the fusible link comprising:

a first conductive member connected to the first end of the test-error mechanism;

a second conductive member connected to the second end of the test-error mechanism;

a connection connecting the first conductive member and the second conductive member and maintaining the test-error mechanism in the first position, the connection being liquefied when the fault detection circuit fails to detect the simulated circuit fault after about the predetermined amount of time; and a spring positioned between the first end and the second end, the spring placing the test-error mechanism in the second position when the connection is liquefied.

35. The fail-safe electronic circuit breaker of claim 31 wherein the fusible link comprises:

a spring connected to a first end of the fusible link;

a plunger connected to the spring;

an electrically resistive member positioned proximate to the plunger for generating heat in the presence of a flowing current; and a connection connecting the plunger and the electrically resistive member and maintaining the test-error mechanism in a first position, the connection being liquefied when the fault detection circuit fails to detect the simulated circuit fault after about the predetermined amount of time, the spring placing the test-error mechanism in the second position when the connection is liquefied.

36. The fail-safe electronic circuit breaker of claim 35 wherein the connection comprises a material having a melting point between about 200° C. to about 300° C.

37. The fail-safe electronic circuit breaker of claim 35 wherein the connection comprises solder.

38. The fail-safe electronic circuit breaker of claim 35 further comprising an indicator connected to the plunger indicating when the test-error mechanism enters the second position.

* * * * *